United States Patent
Lin

(10) Patent No.: US 10,048,318 B2
(45) Date of Patent: Aug. 14, 2018

(54) DETECTION SYSTEM IN RELATION TO AUTOMATIC TRANSFER SWITCH AND METHOD THEREOF

(71) Applicant: HON HAI PRECISION INDUSTRY CO., LTD., New Taipei (TW)

(72) Inventor: Gi-Lung Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 141 days.

(21) Appl. No.: 14/814,992

(22) Filed: Jul. 31, 2015

(65) Prior Publication Data

US 2017/0030970 A1 Feb. 2, 2017

(51) Int. Cl.
*G01R 31/02* (2006.01)
*G01R 31/327* (2006.01)

(52) U.S. Cl.
CPC .................................. *G01R 31/327* (2013.01)

(58) Field of Classification Search
CPC ...... G01R 31/327; G01R 31/40; G01R 31/42; Y10T 307/313; Y10T 307/344; Y10T 307/391; Y10T 307/461; Y10T 307/615
USPC .................... 307/19, 23, 64, 65, 67, 68, 113; 324/415, 764.01; 361/190, 632
See application file for complete search history.

(56) References Cited

U.S. PATENT DOCUMENTS

| | | | | |
|---|---|---|---|---|
| 4,423,336 A | * | 12/1983 | Iverson | H01H 3/26 307/64 |
| 2005/0134121 A1 | * | 6/2005 | Lathrop | H02J 3/005 307/80 |
| 2005/0189817 A1 | * | 9/2005 | Johnson, Jr. | G01R 31/40 307/39 |
| 2006/0167569 A1 | * | 7/2006 | Colombi | H02J 3/005 700/22 |
| 2012/0306274 A1 | * | 12/2012 | Shetler, Jr. | H02J 9/062 307/64 |
| 2016/0343526 A1 | * | 11/2016 | Schicke, II | G01R 31/025 |

* cited by examiner

*Primary Examiner* — Arleen M Vazquez
*Assistant Examiner* — Steven Yeninas
(74) *Attorney, Agent, or Firm* — ScienBiziP, P.C.

(57) ABSTRACT

An automatic transfer switch (ATS) detection system is configured to detect an ATS. The ATS detection system includes an AC source configured to transfer a power signal to the ATS, a power switch, and an electronic load. The power switch includes a first input terminal coupled to a first signal lamp, a second input terminal coupled to a second signal lamp, and an output terminal. The AC source is coupled to the ATS and the second input terminal of the power switch, and the ATS is coupled to the first input terminal of the power switch. The electronic load is coupled to the output terminal of the power switch. The power signal is transferred through the ATS and the power switch, and is received by the electronic load.

10 Claims, 6 Drawing Sheets

DETECTION SYSTEM IN RELATION TO AUTOMATIC TRANSFER SWITCH AND METHOD THEREOF

FIELD

The subject matter herein generally relates to detection systems, and more particularly to an automatic transfer switch detection system and method.

BACKGROUND

The automatic transfer switch (ATS) is used widely. The ATS generally includes two loops, when one of the two loops is cut off, the other loop will be switched on automatically. It is necessary to confirm whether the ATS is in normal condition.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
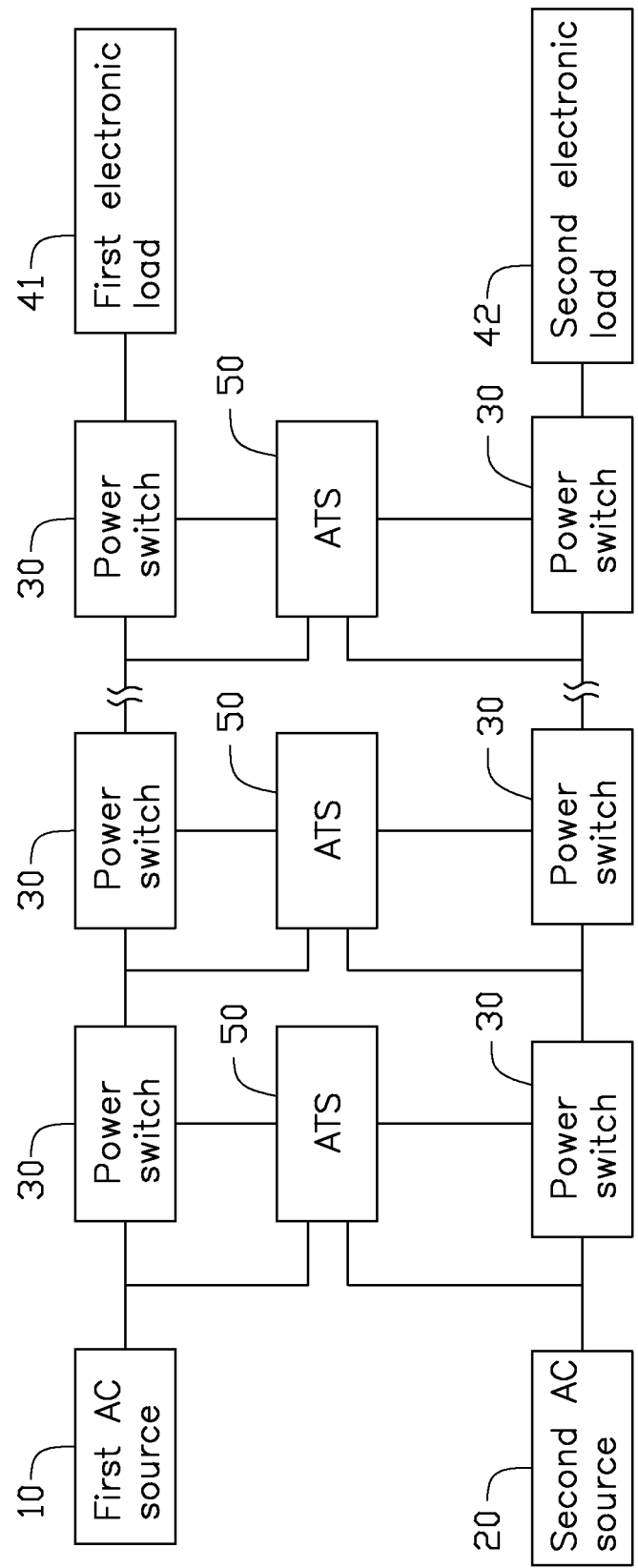
FIG. 1 is a block diagram of one embodiment of an automatic transfer switch detection system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "comprising" when utilized, means "including, but not necessarily limited to"; it specifically indicates open-ended inclusion or membership in the so-described combination, group, series and the like.

Figure 2:
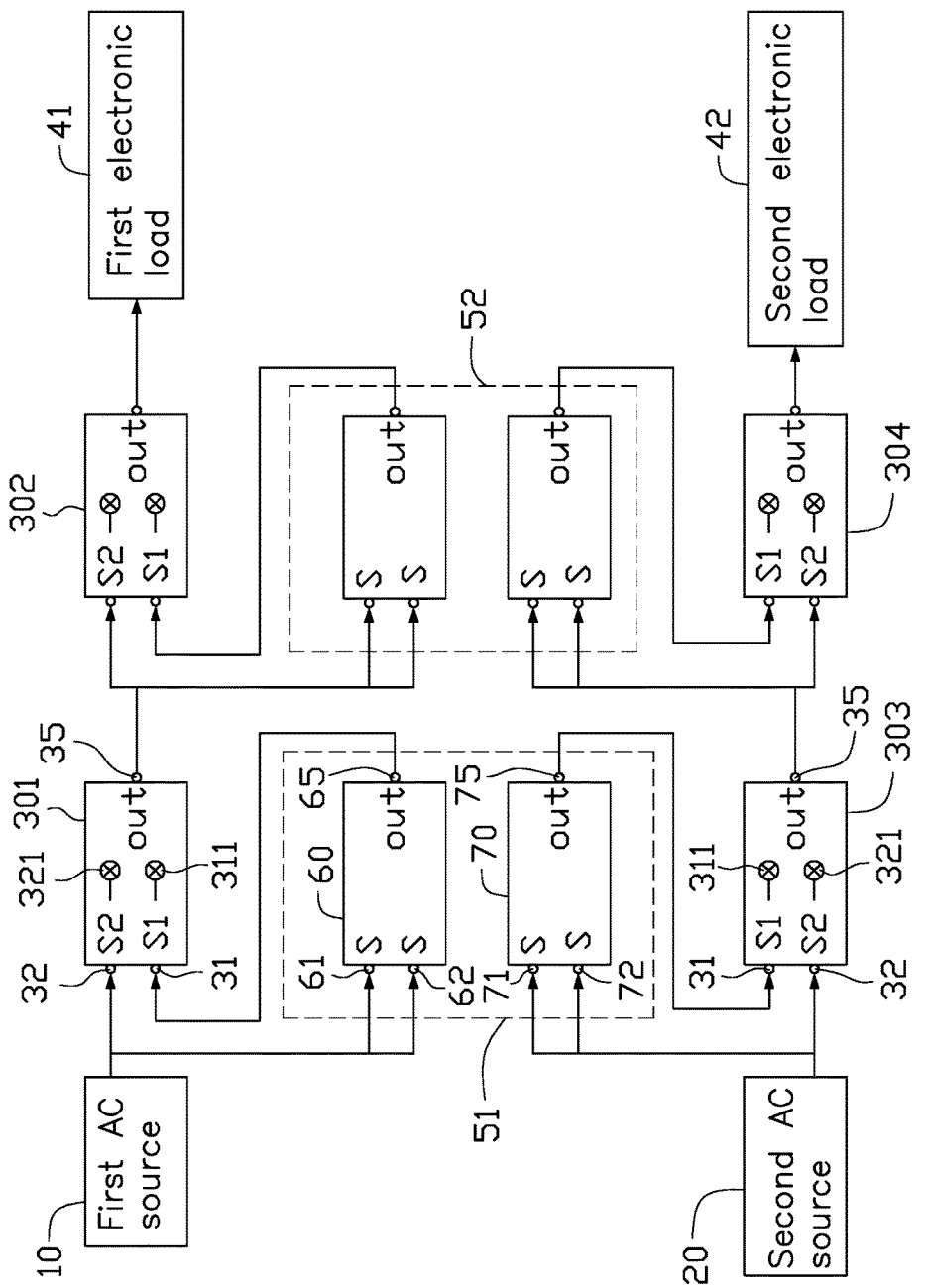
FIG. 2 is a circuit diagram of one embodiment of the automatic transfer switch detection system of FIG. 1.

FIGS. 1 and 2 illustrate one embodiment of an automatic transfer switch (ATS) detection system. The ATS detection system is configured to detect a plurality of automatic transfer switches (ATSs) 50 to confirm whether each ATS 50 is in a normal condition. In at least one embodiment, the ATSs 50 include a first ATS 51 and a second ATS 52.

The ATS detection system includes a first alternating current (AC) source 10, a second AC source 20, a plurality of power switches 30, a first electronic load 41, and a second electronic load 42. Each of the first AC source 10 and the second AC source 20 is configured to transmit a power signal. Each power switch 30 includes a first input terminal 31, a second input terminal 32, and an output terminal 35. The first input terminal 31 is equipped with a first signal lamp 311 and the second input terminal 32 is equipped with a second signal lamp 321. The first electronic load 41 and the second electronic load 42 will respectively receive the power signal of the first AC source 10 and the second AC source 20. In at least one embodiment, the number of the power switches 30 is four, namely a first power switch 301, a second power switch 302, a third power switch 303, and a fourth power switch 304; the ATS detection system comprises a first system and a second system; the first system comprises the first AC source 10, the first power switch 301, the second power switch 302, and the first electronic load 41; the second system comprises the second AC source 20, the third power switch 303, and the fourth power switch 304, and the second electronic load 42.

Figure 5:
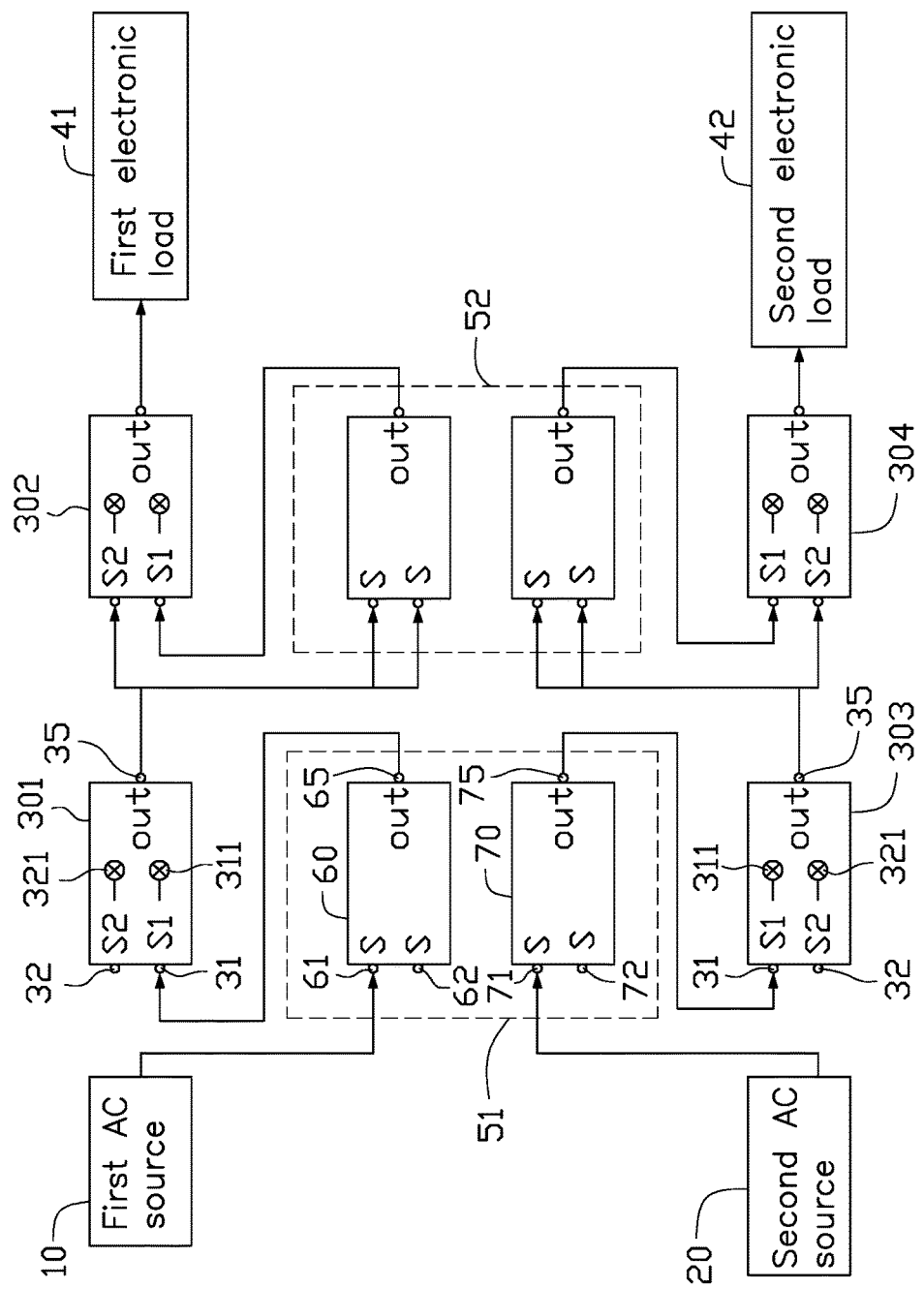
FIG. 5 is a circuit diagram of another embodiment of the automatic transfer switch detection system of FIG. 1.
Figure 6:
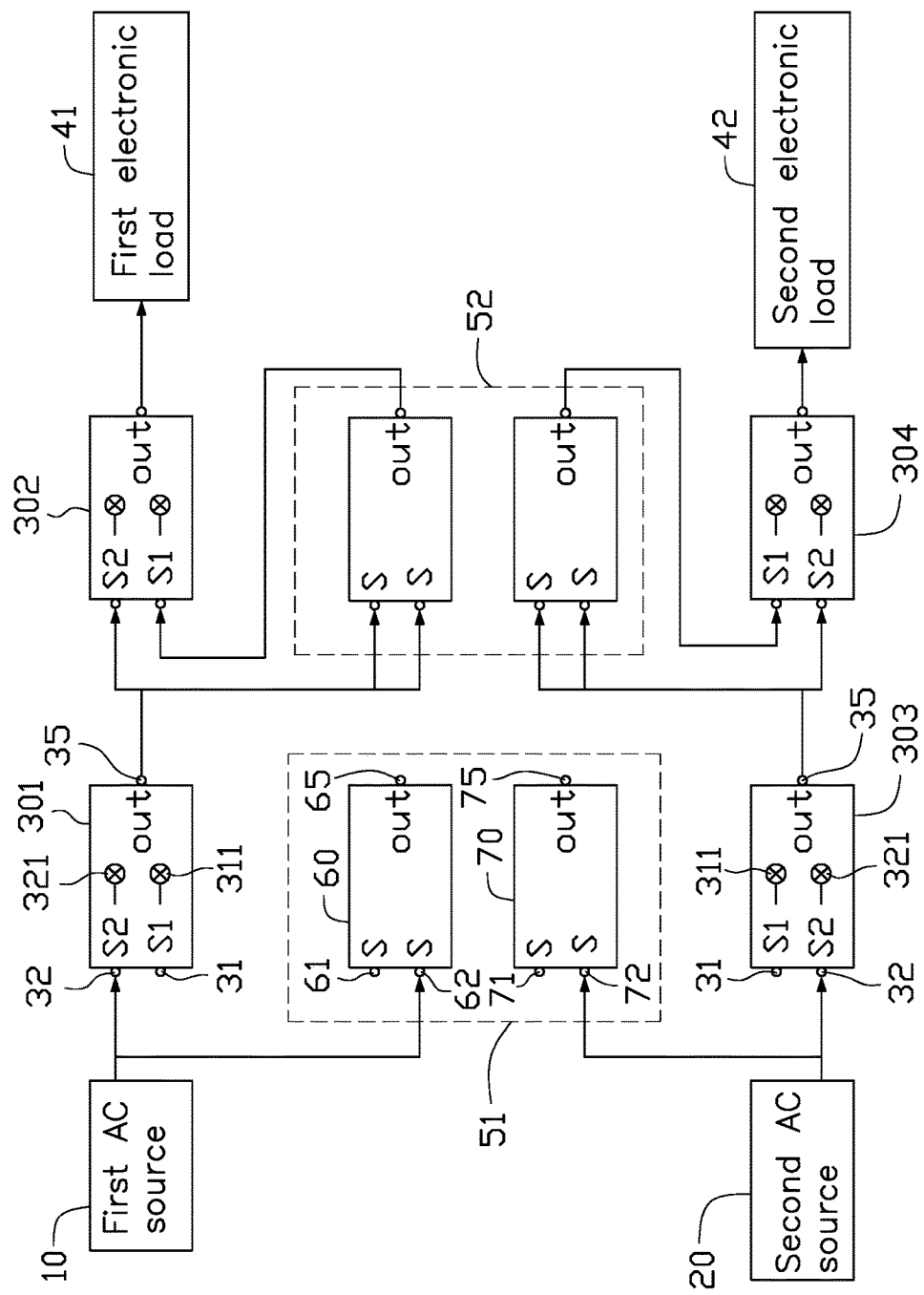
FIG. 6 is a circuit diagram of another embodiment of the automatic transfer switch detection system of FIG. 1.

Each ATS 50 includes a first conversion module 60 and a second conversion module 70. Each first conversion module 60 includes a first input terminal 61, a second input terminal 62, and a first output terminal 65. Each second conversion module 70 includes a first input terminal 71, a second input terminal 72, and a second output terminal 75. One of the first, second input terminals 31, 32 of each power switch 30 can be electronically connected according to a condition of the conversion module. FIG. 5 illustrates that in a first embodiment, the first conversion module 60 of the first ATS 51 is in a normal condition, the first input terminal 31 of the first power switch 301 is electronically connected to the first output terminal 65 of the first ATS 51, the second input terminal 32 of the first power switch 301 is electronically disconnected from the first AC source 10, the first input terminal 61 of the first ATS 51 is electronically connected to the first AC source 10, the second input terminal 62 of the first ATS 51 is electronically disconnected from the first AC source 10; the second conversion module 70 of the first ATS 51 is in a normal condition, the first input terminal 31 of the third power switch 303 is electronically connected to the second output terminal 75 of the first ATS 51, the second input terminal 32 of the third power switch 303 is electronically disconnected from the second AC source 20, the first input terminal 71 of the first ATS 51 is electronically connected to the second AC source 20, the second input terminal 72 of the first ATS 51 is electronically disconnected from the second AC source 20. FIG. 6 illustrates that in a second embodiment, the first conversion module 60 of the first ATS 51 is in an abnormal condition, the first input terminal 31 of the first power switch 301 is electronically disconnected from the first output terminal 65 of the first ATS 51, the second input terminal 32 of the first power switch 301 is electronically connected to the first AC source 10, the second input terminal 62 of the first ATS 51 is electronically connected to the first AC source 10, the first input terminal 61 of the first ATS 51 is electronically disconnected from the first AC source 10; the second conversion module 70 of the first ATS 51 is in an abnormal condition, the first input terminal 31 of the third power switch 303 is electronically disconnected from the second output terminal 75 of the first ATS 51, the second input terminal 32 of the third power switch 303 is electronically connected to the second AC source 20, the second input terminal 72 of the first ATS 51 is electronically connected to the second AC source 20, the first input terminal 71 of the first ATS 51 is electronically disconnected from the second AC source 20.

In operation, the first AC source 10 is physically coupled to the first, second input terminals 61, 62 of the first ATS 51 and a second input terminal 32 of the first power switch 301. The first output terminal 65 of the first ATS 51 is physically coupled to the first input terminal 31 of the first power switch 301. The output terminal 35 of the first power switch 301 is physically coupled to the first, second input terminals 61, 62 of the second ATS 52 and a second input terminal 32 of the second power switch 302. The first output terminal 65 of the second ATS 52 is physically coupled to the first input terminal 31 of the second power switch 302. The output terminal 35 of the second power switch 302 is physically coupled to the first electronic load 41.

The second AC source 20 is physically coupled to the first, second input terminals 71, 72 of the first ATS 51 and a second input terminal 32 of the third power switch 303. The second output terminal 75 of the first ATS 51 is physically coupled to the first input terminal 31 of the third power switch 303. The output terminal 35 of the third power switch 303 is physically coupled to the first, second input terminals 71, 72 of the second ATS 52 and a second input terminal 32 of the fourth power switch 304. The second output terminal 75 of the second ATS 52 is physically coupled to the first input terminal 31 of the fourth power switch 304. The output terminal 35 of the fourth power switch 304 is physically coupled to the second electronic load 42.

FIG. 2 illustrates that when the ATS detection system is operated, each of the first AC source 10 and the second AC source 20 sends out a power signal, the power signal from the first AC source 10 is received by the first electronic load 41, and the power signal from the second AC source 20 is received by the second electronic load 42.

FIG. 5 illustrates that when the first conversion module 60 of the first ATS 51 is in a normal condition, the first input terminal 31 of the first power switch 301 is electronically connected to the first output terminal 65 of the first ATS 51, the second input terminal 32 of the first power switch 301 is electronically disconnected from the first AC source 10, the first input terminal 61 of the first ATS 51 is electronically connected to the first AC source 10, the second input terminal 62 of the first ATS 51 is electronically disconnected from the first AC source 10, the power signal of the first AC source 10 is transferred through the first conversion module 60 of the first ATS 51, the first input terminal 31 of the first power switch 301, the second ATS 52, and the first input terminal 31 of the second power switch 302, then the power signal of the first AC source 10 is received by the first electronic load 41. The first signal lamp 311 of the first power switch 301 is illuminated and green. FIG. 6 illustrates that when the first conversion module 60 of the second ATS 52 is in an abnormal condition, the first input terminal 31 of the first power switch 301 is electronically disconnected from the first output terminal 65 of the first ATS 51, the second input terminal 32 of the first power switch 301 is electronically connected to the first AC source 10, the second input terminal 62 of the first ATS 51 is electronically connected to the first AC source 10, the first input terminal 61 of the first ATS 51 is electronically disconnected from the first AC source 10, the power signal of the first AC source 10 is transferred through the second input terminal 32 of the first power switch 301, the second ATS 52, and the first input terminal 31 of the second power switch 302 then the power signal of the first AC source 10 is received by the first electronic load 41. The second signal lamp 321 of the first power switch 301 is illuminated and red. The same situation applies to the first ATS 51, if the first conversion module 60 of the ATS 52 is in an abnormal condition, the second signal lamp 321 of the power second switch 302 is illuminated and red.

The same situation applies to the first conversion module 60; if the second conversion module 70 of the first ATS 51 is in a normal condition, the first signal lamps 311 of the third power switch 303 is illuminated and green. If the second conversion module 70 of the first ATS 51 is in the abnormal condition, the second signal lamp 321 of the third power switch 303 is illuminated and red. Similarly with the first ATS 51, if the second conversion module 70 of the ATS 52 is in abnormal condition, the second signal lamp 321 of the fourth power switch 304 is illuminated and red.

Figure 3:
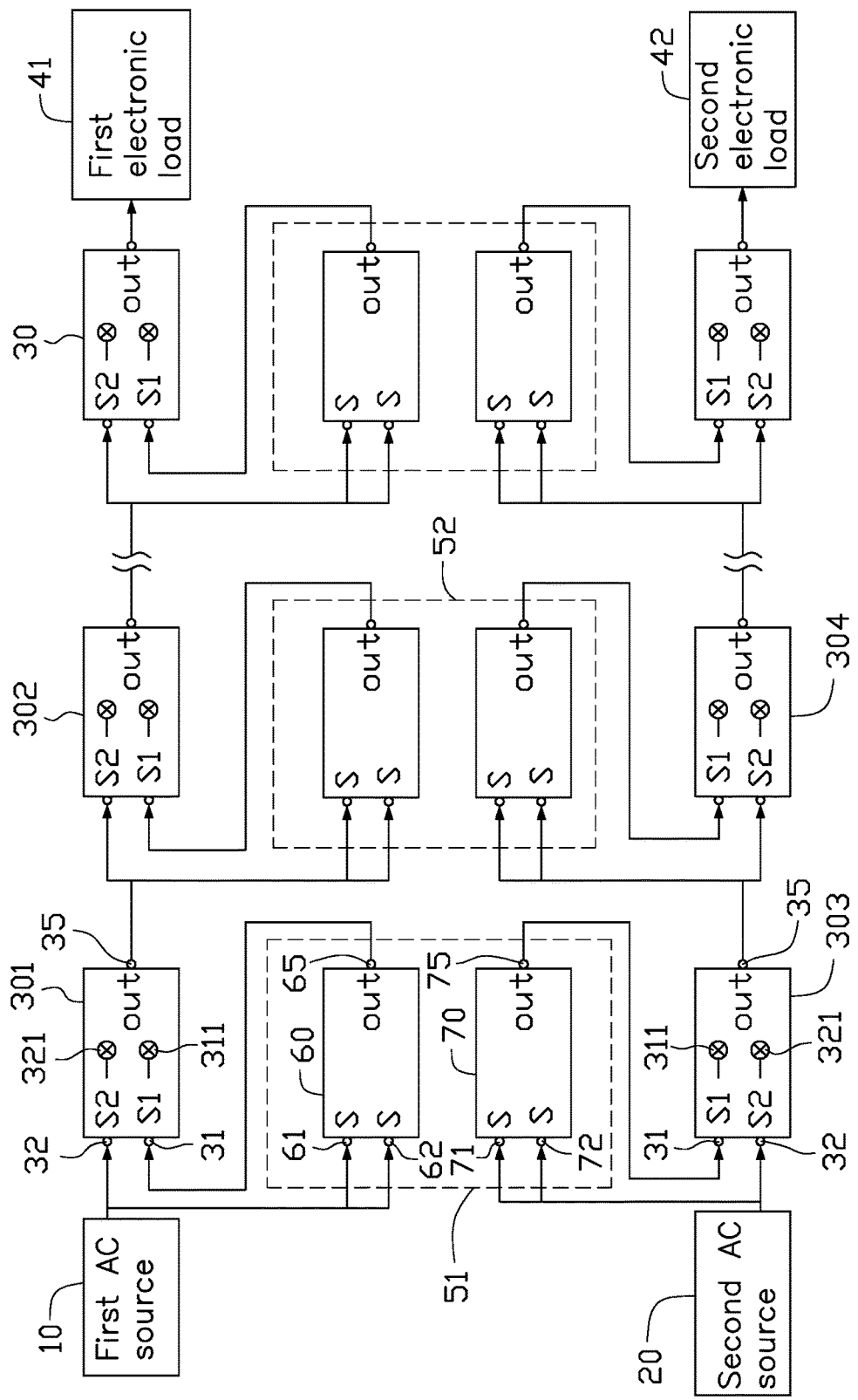
FIG. 3 is a circuit diagram of another embodiment of the automatic transfer switch detection system of FIG. 1

FIG. 3 illustrates another embodiment of an ATS detection system. The number of ATSs 50 can be one, three, or more and the number of the power switches 30 can be two, six, or more.

Figure 4:
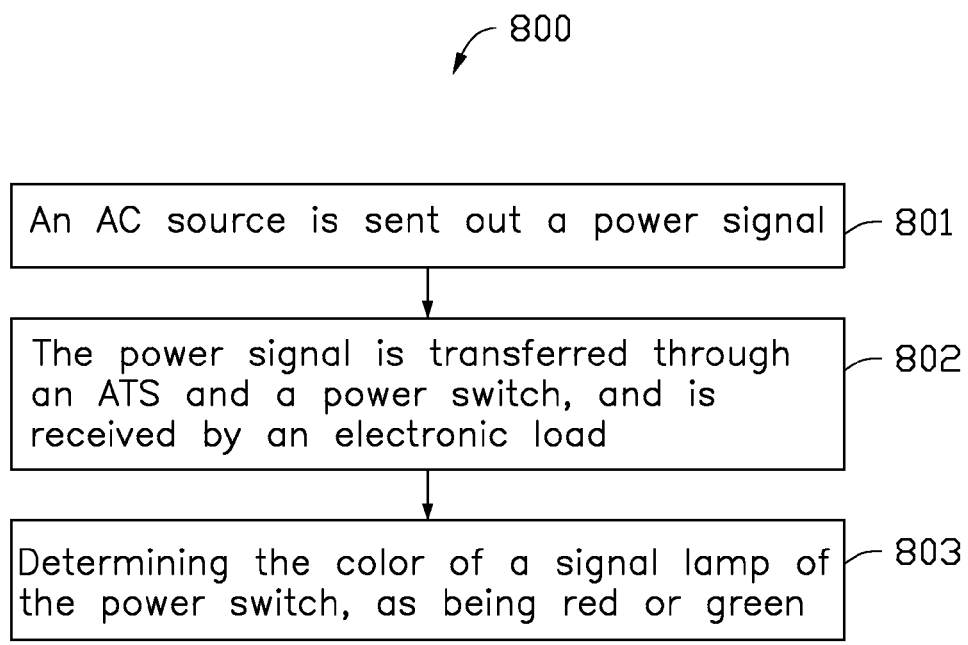
FIG. 4 is a flowchart of an automatic transfer switch detection method of FIG. 1.

Referring to FIG. 4, a flowchart is presented in accordance with an example embodiment. The example method is provided by way of example, as there are a variety of ways to carry out the method. The method described below can be carried out using the configurations illustrated in FIG. 4, for example, and various elements of these figures are referenced in explaining the example method. Each block shown in FIG. 4 represents one or more processes, methods, or subroutines carried out in the example method. Furthermore, the illustrated order of blocks is illustrative only and the order of the blocks can change. Additional blocks can be added or fewer blocks may be utilized without departing from this disclosure. The example method can begin at block 801.

At block 801, an AC source is sent out a power signal.

At block 802, the power signal is transferred through an ATS and a power switch, and is received by an electronic load.

At block 803, determining the color of a signal lamp of the power switch, as being red or green.

The embodiments shown and described above are only examples. Many details are often found in the art such as the other features of an automatic transfer switch detection system. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An automatic transfer switch (ATS) detection system for detecting a plurality of automatic transfer switches (ATSs), each ATS comprising a first conversion module, the ATS detection system comprising:
 a first AC source configured to transfer a power signal to a first ATS;

a first power switch, the first power switch comprising a first input terminal, a first signal lamp, a second input terminal, a second signal lamp, and an output terminal; and a second power switch, the second power switch comprises a first input terminal, a first signal lamp, a second input terminal, a second signal lamp, and an output terminal;

a first electronic load coupled to the output terminal of the second power switch; and the output terminal of the first power switch coupled to the second input terminal of the second power switch;

wherein each first conversion module comprises a first input terminal, a second input terminal, and a first output terminal;

wherein the first input terminal of the first power switch is coupled to the first signal lamp of the first power switch, the second input terminal of the first power switch is coupled to the second signal lamp of the first power switch;

wherein when the first conversion module of the first ATS is in a normal condition, the first input terminal of the first power switch is electronically connected to the first output terminal of the first conversion module of the first ATS, the second input terminal of the first power switch is electronically disconnected from the first AC source, the first input terminal of the first conversion module of the first ATS is electronically connected to the first AC source, the second input terminal of the first conversion module of the first ATS is electronically disconnected from the first AC source, the first signal lamp of the first power switch is illuminated.

2. The ATS detection system of claim 1, wherein the second signal lamp of the first power switch is configured to turn to red when the first conversion module of the first ATS is in an abnormal condition.

3. The ATS detection system of claim 1, wherein when the first conversion module of a second ATS is in a normal condition, the first input terminal of the second power switch is electronically connected to the first output terminal of the first conversion module of the second ATS, the second input terminal of the second power switch is electronically disconnected from the first AC source, the first input terminal of the first conversion module of the second ATS is electronically connected to the first AC source, the second input terminal of the first conversion module of the second ATS is electronically disconnected from the first AC source, the first signal lamp of the second power switch is illuminated.

4. The ATS detection system of claim 3, wherein the first signal lamp of the second power switch is configured to turn to green when the first conversion module of the second ATS is in the normal condition.

5. The ATS detection system of claim 3, wherein the second signal lamp of the second power switch is configured to turn to red when the first conversion module of the second ATS is in an abnormal condition.

6. The ATS detection system of claim 3, wherein the first signal lamp of the first power switch is configured to turn to green when the first conversion module of the first ATS is in the normal condition.

7. An automatic transfer switch (ATS) detection system for detecting a plurality of automatic transfer switches (ATSs), each ATS comprising a first conversion module, the ATS detection system comprising:

a first AC source configured to transfer a power signal to a first ATS;

a first power switch, the first power switch comprising a first input terminal, a first signal lamp, a second input terminal, a second signal lamp, and an output terminal;

a second power switch, the second power switch comprises a first input terminal, a first signal lamp, a second input terminal, a second signal lamp, and an output terminal;

a first electronic load coupled to the output terminal of the second power switch; and the output terminal of the first power switch coupled to the second input terminal of the second power switch;

wherein each first conversion module comprises a first input terminal, a second input terminal, and a first output terminal;

wherein the first input terminal of the first power switch is coupled to the first signal lamp of the first power switch, the second input terminal of the first power switch is coupled to the second signal lamp of the first power switch;

wherein the first input terminal of the second power switch is coupled to the first signal lamp of the second power switch, the second input terminal of the second power switch is coupled to the second signal lamp of the second power switch; the first electronic load is coupled to the output terminal of the second power switch;

wherein when the first conversion module of the first ATS is in a normal condition, the first input terminal of the first power switch is electronically connected to the first output terminal of the first conversion module of the first ATS, the second input terminal of the first power switch is electronically disconnected from the first AC source, the first input terminal of the first conversion module of the first ATS is electronically connected to the first AC source, the second input terminal of the first conversion module of the first ATS is electronically disconnected from the first AC source, the first signal lamp of the first power switch is illuminated; and wherein when the first conversion module of a second ATS is in a normal condition, the first input terminal of the second power switch is electronically connected to the first output terminal of the first conversion module of the second ATS, the second input terminal of the second power switch is electronically disconnected from the first AC source, the first input terminal of the first conversion module of the second ATS is electronically connected to the first AC source, the second input terminal of the first conversion module of the second ATS is electronically disconnected from the first AC source, the first signal lamp of the second power switch is illuminated.

8. The ATS detection system of claim 7, wherein the first signal lamp of the second power switch is configured to turn to green when the first conversion module of the second ATS is in the normal condition.

9. The ATS detection system of claim 8, wherein the second signal lamp of the second power switch is configured to turn to red when the first conversion module of the second ATS is in an abnormal condition.

10. The ATS detection system of claim 9, wherein the first signal lamp of the first power switch is configured to turn to green when the first conversion module of the first ATS is in the normal condition.

* * * * *